United States Patent [19]

Tseng et al.

[11] Patent Number: 5,759,894
[45] Date of Patent: Jun. 2, 1998

[54] METHOD FOR FORMING A DRAM CAPACITOR USING HSG-SI

[75] Inventors: Horng-Huei Tseng; Chih-Yuan Lu, both of Hsinchu, Taiwan

[73] Assignee: Vanguard International Semiconductor Corporation, Hsinchu, Taiwan

[21] Appl. No.: 808,338

[22] Filed: Feb. 28, 1997

[51] Int. Cl.⁶ .................................................. H01L 21/8242
[52] U.S. Cl. .......................................... 438/255; 438/766
[58] Field of Search ................................ 438/253, 255, 438/396, 398, 659, 665, 766, 964

[56] References Cited

U.S. PATENT DOCUMENTS

| | | | |
|---|---|---|---|
| 5,213,992 | 5/1993 | Lu | 438/255 |
| 5,302,540 | 4/1994 | Ko et al. | 438/255 |
| 5,464,791 | 11/1995 | Hirota | 438/253 |

OTHER PUBLICATIONS

H. Arima, et al., "A Novel Stacked Capacitor with Dual Cell Plate for 64Mb DRAMs", *1990 IEDM*, pp. 651–654, (1990).
M. Sakao, et al., "A Capacitor–Over–Bit–Line (COB) Cell with a Hemispherical–Grain Storage Node for 64Mb DRAMs", *1990 IEDM*, pp. 655–658, (1990).
H. Watanabe, et al., "A New Cylindrical Capacitor Using Hemispherical Grained Si (HSG–Si) for 256Mb DRAMs", *1990 IEDM*, pp. 259–262, (1990).

*Primary Examiner*—Chandra Chaudhari
*Attorney, Agent, or Firm*—Christensen, O'Connor Johnson & Kindness PLLC

[57] ABSTRACT

A method for forming a DRAM capacitor using HSG-Si includes forming a dielectric layer over a substrate. A portion of the dielectric layer is removed to expose a contact area on the substrate. A polysilicon layer is then formed over the dielectric layer and in the first trench. Then, a hemispherical-grained silicon (HSG-Si) layer is formed on the polysilicon layer using an initial phase HSG-Si process, thereby forming a large number of silicon grains on the polysilicon layer. Next, nitrogen atoms are implanted into the polysilicon layer using the HSG-Si layer as a mask to form nitrogen regions in the polysilicon layer. The HSG-Si layer is then removed and the polysilicon layer is thermally oxidized. The nitrogen regions function as an anti-oxidation mask so that polysilicon-oxide regions are formed between the nitrogen regions in the polysilicon layer. Afterwards, an etching process is performed using the polysilicon-oxide regions as a mask so that the nitrogen regions and portions of the polysilicon layer beneath the nitrogen regions are removed. This etching step forms second trenches in the polysilicon layer between the polysilicon-oxide regions, which are subsequently removed. After removing the polysilicon-oxide regions, the polysilicon layer is patterned and etched to form a bottom electrode of the capacitor of the dynamic random access memory. The capacitor dielectric and the top electrode of the capacitor are then formed using conventional methods.

20 Claims, 5 Drawing Sheets

5,759,894

1

METHOD FOR FORMING A DRAM CAPACITOR USING HSG-SI

BACKGROUND OF THE INVENTION

1. Field of the Invention

The present invention relates to dynamic random access memory (DRAM) fabrication, and more particularly to a method for forming a capacitor of a dynamic random access memory cell.

2. Background Art

Recently, demand for semiconductor devices has rapidly increased owing to widespread use of electronic equipment. In particular, the increasing popularity of some electronic equipment such as computers, for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18, respectively. The row decoder 16 and the column decoder 18 then respectively select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode

2 surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

Another consideration in achieving high density memory devices is the limitations of lithography techniques widely used in the semiconductor industry. The so-called "minimum feature size" (i.e., the minimum line-width, contact dimensions, or line-to-line separation that can be formed on the substrate surface) of the photolithographic process limits the number of circuits that can be fabricated on the wafer. The minimum feature size is largely determined by the resolution of an optical imaging system used in the photolithography process. The minimum feature size can be reduced, but typically at the cost of further reducing the depth of focus and restricting flexibility in the design of three-dimensional structures. Accordingly, there is a need for a method of forming a DRAM capacitor with features that are smaller than the minimum feature size of the photolithographic process while increasing the surface area of the capacitor electrodes.

SUMMARY

In accordance with the present invention, a method is provided for forming a DRAM capacitor that substantially increases the surface area of the electrode, which increases the capacitance of the capacitor. In one embodiment, an oxide layer is formed over a substrate, and a first photoresist layer is formed and patterned on the oxide layer to define a contact area over a portion of the substrate surface. The oxide layer is then etched using the first photoresist layer as a mask. After etching the oxide layer, a first trench is formed, thereby exposing a portion of the substrate surface. Next, a doped polysilicon layer is formed over the oxide layer so that the first trench in the oxide layer is filled by the doped polysilicon layer. Subsequently, a hemispherical-grained silicon (HSG-Si) layer is formed on the polysilicon layer, where the HSG-Si layer includes a relatively large number of silicon grains spaced apart. The HSG-Si grains are deposited so that the nominal spacing between the grains is less than the minimum dimension of currently available photolithography processes.

Because the HSG-Si grains are spaced apart, portions of the doped polysilicon layer surrounding each grain is left exposed. Nitrogen atoms are then implanted into the doped polysilicon layer using the silicon grains as a mask, thereby forming nitrogen regions in the portions of the polysilicon layer left uncovered by the silicon grains. The HSG-Si layer is then removed, thereby exposing sub-minimum dimension portions of the polysilicon layer. The doped polysilicon layer is then thermally oxidized using the nitrogen regions as an anti-oxidation mask, thereby forming a relatively large number of polysilicon-oxide regions in and on the polysilicon layer. Subsequently, the nitrogen regions and portions of the doped polysilicon layer are removed using the polysilicon-oxide regions as a mask, thereby forming a relatively large number of second trenches in the polysilicon layer. The second trenches are spaced apart by a sub-minimum dimension distance, allowing the surface area of the polysilicon layer to be advantageously increased. In addition, the second trenches are formed without using a photoresist mask, which simplifies the fabrication process. After removing the polysilicon-oxide regions, a second photoresist layer is formed and patterned on the doped polysilicon layer to define a storage node over a portion of the doped polysilicon layer, where pattern of the second photoresist layer is aligned with the first trench. Finally, portions of the polysilicon layer are removed to form a storage node, which serves as a bottom electrode of the capacitor of a DRAM memory cell. The sub-minimum dimension spacing of the second trenches allows the surface area of the bottom electrode to be increased without increasing the area that the bottom electrode occupies on the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
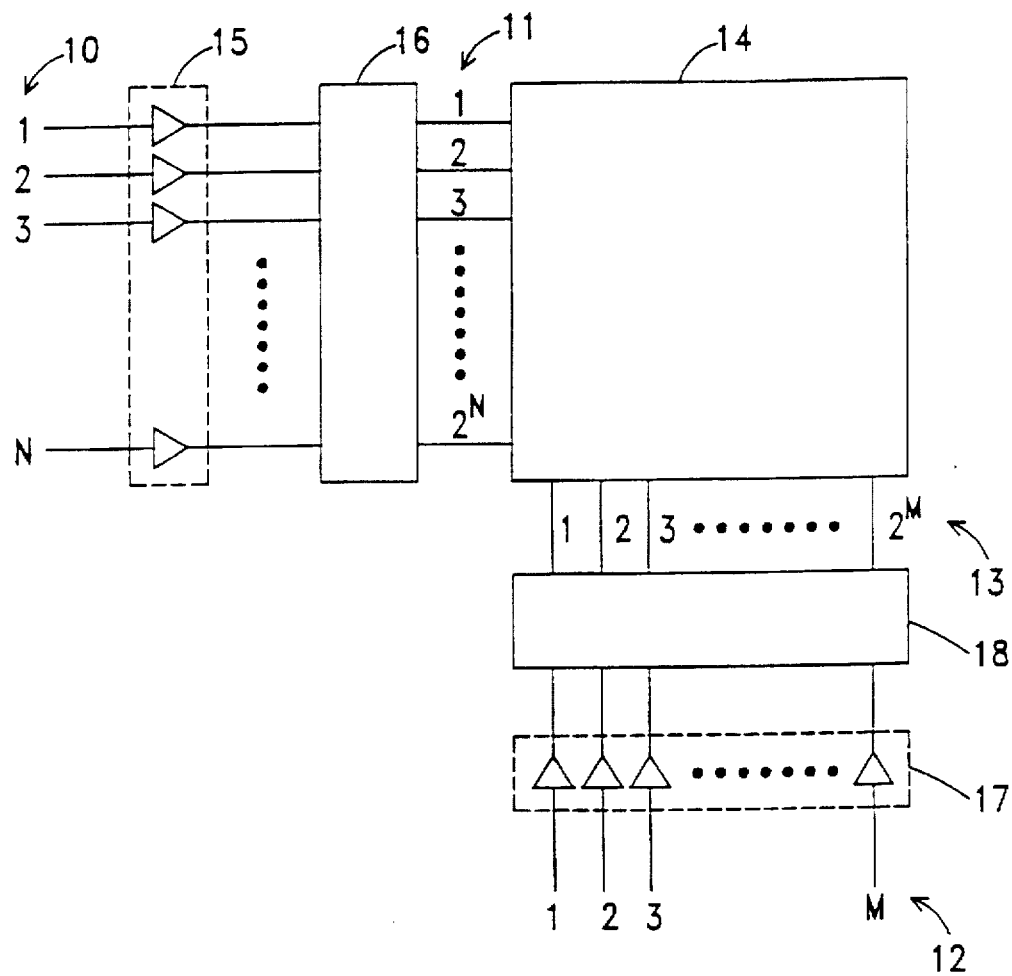
FIG. 1 is a simplified block diagram illustrating the organization of a typical large semiconductor memory.
Figure 2A:
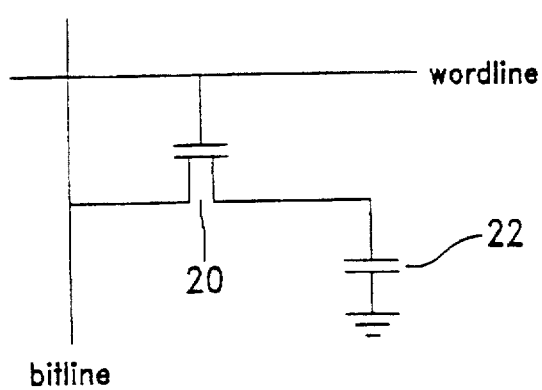
FIG. 2A is a circuit schematic diagram of a dynamic random access memory (DRAM)
Figure 2B:
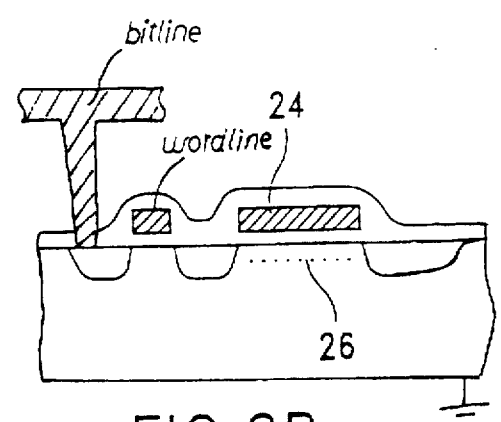
FIG. 2B is a cross sectional diagram illustrative of a traditional one-transistor DRAM storage cell.
Figure 3:
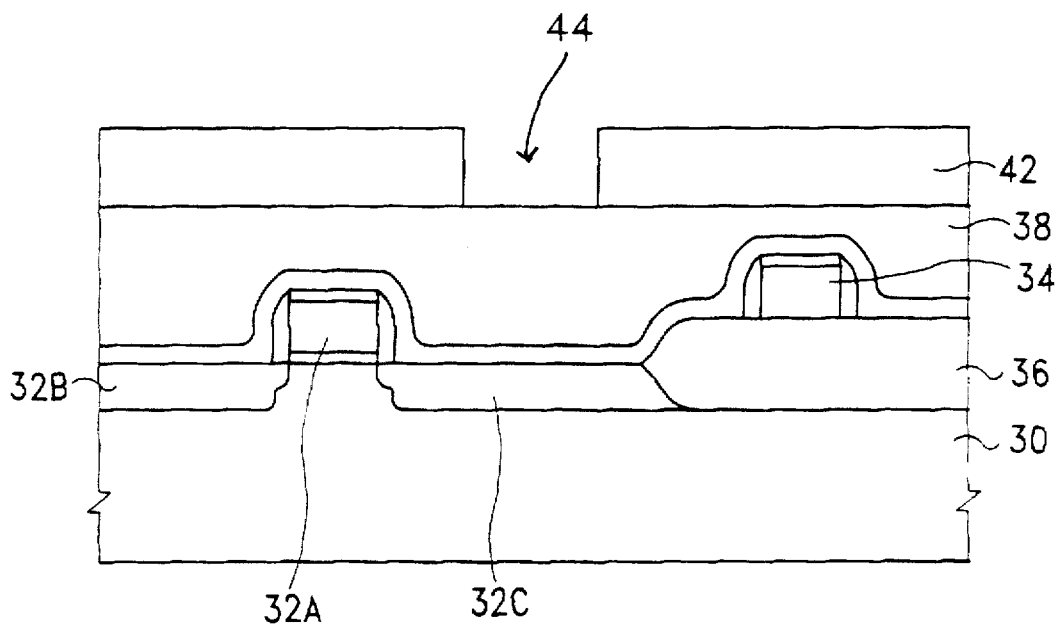
FIGS. 3 to 10 are cross-sectional diagrams illustrative of various stages in the fabrication of a DRAM capacitor electrode in accordance with one embodiment of the present invention.

Referring to FIG. 3, a metal-oxide-semiconductor field effect transistor (MOSFET) having a gate 32A, a drain 32B and a source 32C, is conventionally formed in and on the substrate 30. In addition, a field oxide (FOX) region 36 is conventionally formed in the substrate 30 adjacent to the source 32C. A word line 34 is formed on the FOX region 36. Typically, the word line 34 is made of doped polysilicon. In this embodiment, the MOSFET is a n-channel MOSFET that forms part of a dynamic random access memory (DRAM) cell. A dielectric layer 38 is formed over the MOSFET and on the substrate 30. In this example, the dielectric layer 38 is an oxide layer formed using a chemical vapor deposition (CVD) method to a thickness of about 3000 to 8000 angstroms. The oxide layer 38 can be a doped oxide layer, an undoped oxide layer or combination thereof The oxide layer 38 is then planarized by a conventional planarization method such as, for example, chemical mechanical polishing (CMP) to reduce the topography and aid in subsequent photolithography processes. Afterwards, conventional photolithography techniques are used to define a storage node contact area in a photoresist layer 42 formed on the oxide layer 38. The photoresist layer 42 is patterned to expose a portion of the oxide layer 38 over the source 32C. In order to fabricate a high density DRAM, the width of the exposed portion of the oxide layer 38 is chosen at or near the minimum feature size of the photolithography techniques used. In other embodiments, the storage node contact can be fabricated using other suitable techniques.

Using the photoresist layer 42 as an etching mask, the oxide layer 38 is anisotropically etched. In this embodiment, a magnetic enhanced reactive ion etch (MERIE) plasma method is used to etch the oxide. A node trench 44 is thus formed in the oxide layer 38 as shown in FIG. 4, exposing a portion of the source region 32C.

Figure 4:
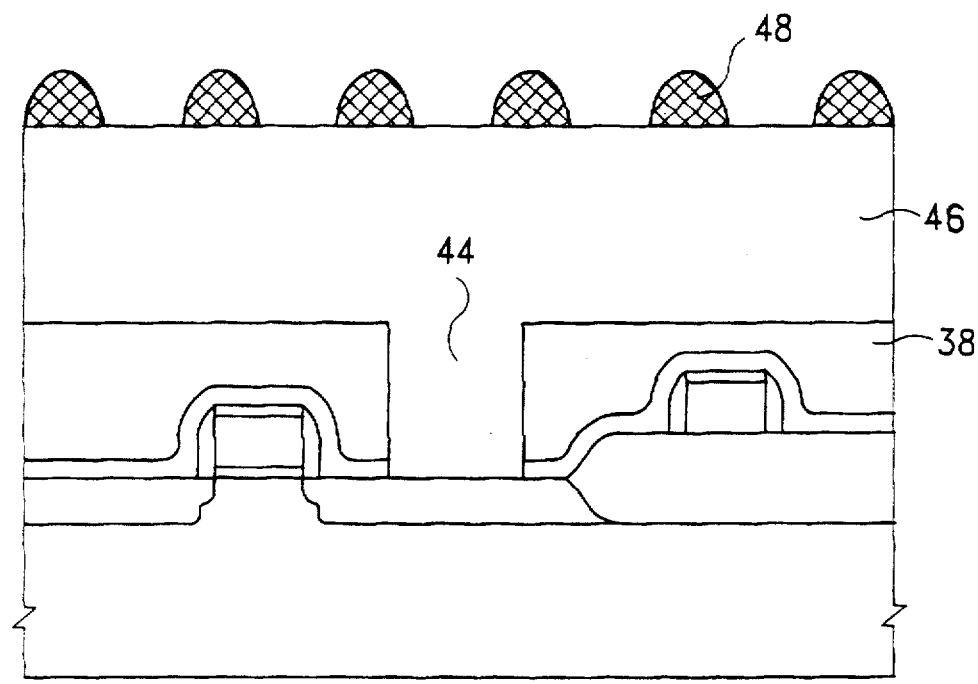

A relatively thick doped polysilicon layer 46, shown in FIG. 4, is formed over the oxide layer 38 so as to fill the trench 44. The nominal thickness of the doped polysilicon layer 46 above the oxide layer 38 is about 2000 to 5000 angstroms. In this embodiment, the polysilicon layer 46 is deposited using a conventional LPCVD process. Typically, the polysilicon layer 46 is doped with phosphorus dopants at a concentration of about 1E20~1E21 atoms/cm$^3$ to increase conductivity.

Afterwards, an undoped hemispberical-grained silicon (HSG-Si) layer 48 is formed on the polysilicon layer 46 using a standard HSG-Si process referred to as "initial phase HSG-Si", which results in the formation of a large number of HSG-Si grains on the surface of the polysilicon layer 46. In this embodiment, the nominal diameter of each HSG-Si grain is about 50~500 angstroms, and the distance between the adjacent grains is about 100~1000 angstroms, which is significantly smaller that the minimum spacing achieved using standard photolithographic techniques. The HSG-Si layer 48 can be alternatively formed by addition of two process steps, i.e., HSG polysilicon deposition and an etchback. In this alternative embodiment, the HSG polysilicon is deposited by low pressure chemical vapor deposition (LPCVD) with He-diluted SiH$_4$ (20%) gas at 1.0 torr pressure at a temperature of about 550° C. Thereafter, the HSG-polysihcon is etchbacked without any etching mask using a reactive ion etching (RIE) process using HBr gas.

Figure 5:
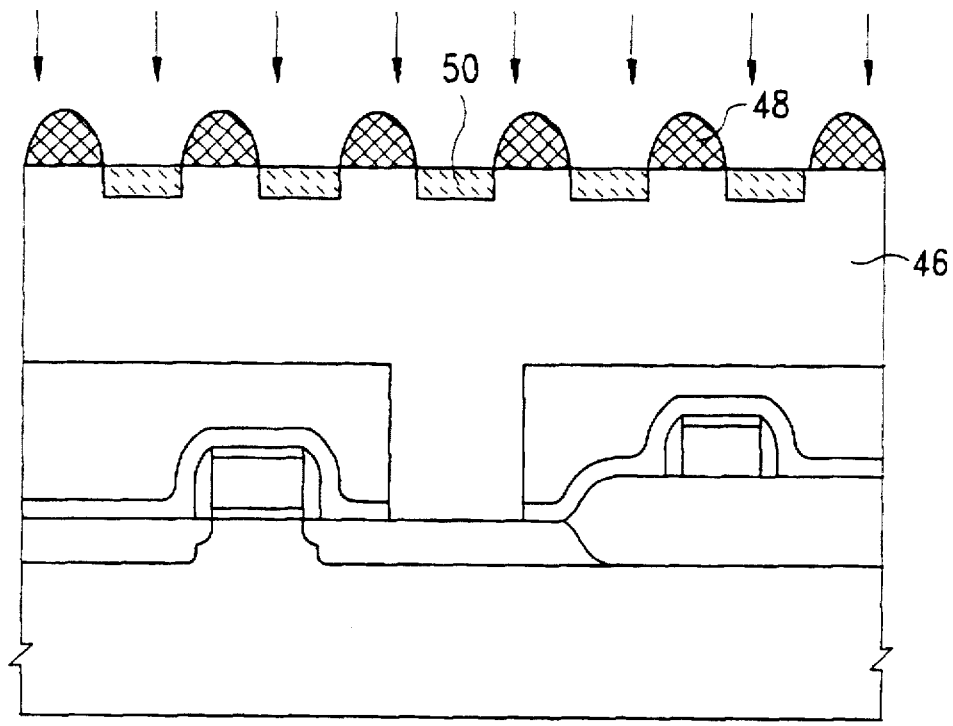

Referring to FIG. 5, atoms such as nitrogen (N$_2$) atoms are implanted into the polysilicon layer 46 using a standard implant process, with the HSG-Si layer 48 serving as an implant mask. This implant process thus forms nitrogen regions 50 in portions of the polysilicon layer 46 left uncovered by the HSG-Si grains. These nitrogen regions 50 will be used as an anti-oxidation mask under thermal oxidation process that is described below in conjunction with FIG. 7.

Figure 6:
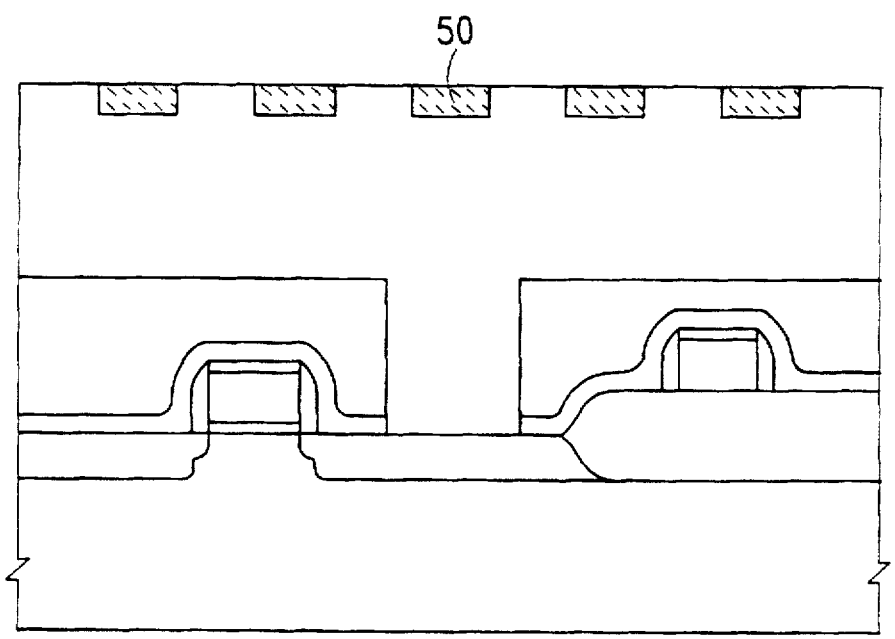
Figure 7:
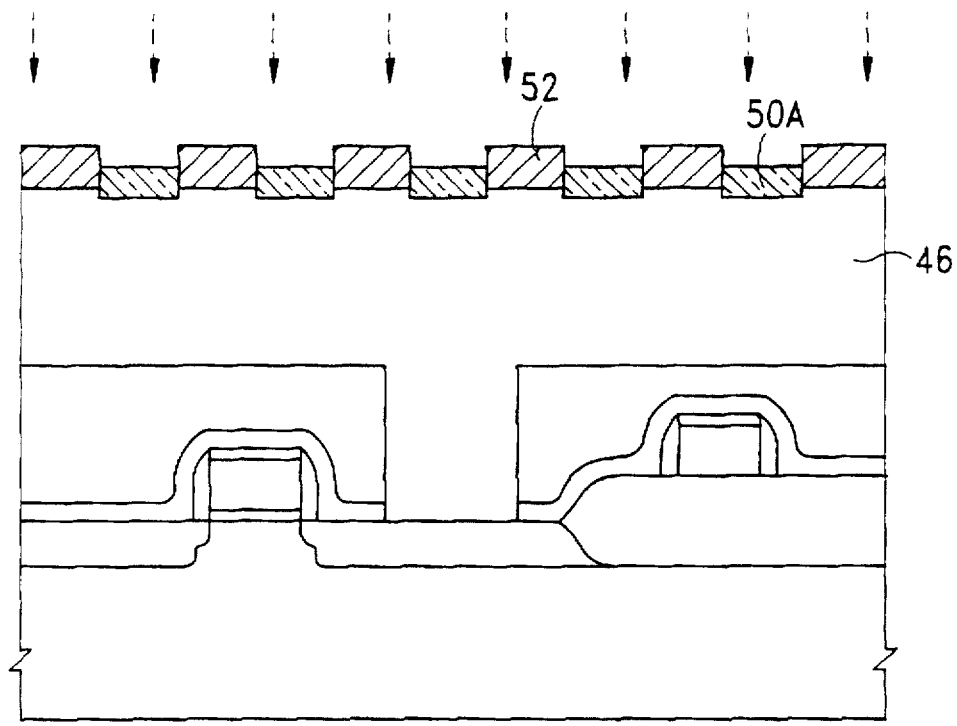

Next, the HSG-Si layer 48 is removed, for example, by a conventional chemical-mechanical polish (CMP) process, resulting in the structure shown in FIG. 6. This structure is then subjected to a standard thermal oxidation process using the nitrogen regions 50 as an anti-oxidation mask. In this embodiment, the polysilicon layer 46 is oxidized at about 700°~900° C. Consequently, polysilicon-oxide regions 52 are grown between the nitrogen regions 50 as shown in FIG. 7. The nitrogen regions 50 prevent thermal oxidation of the portions of the polysilicon layer 46 beneath the nitrogen regions and, in addition, the nitrogen in the nitrogen regions 50 reacts with the polysilicon to form silicon-oxide-nitride Si$_x$O$_y$N$_z$. These polysilicon-oxide regions 52 are used as an etch mask in a succeeding step that is described below in conjunction with FIG. 8.

Figure 8:
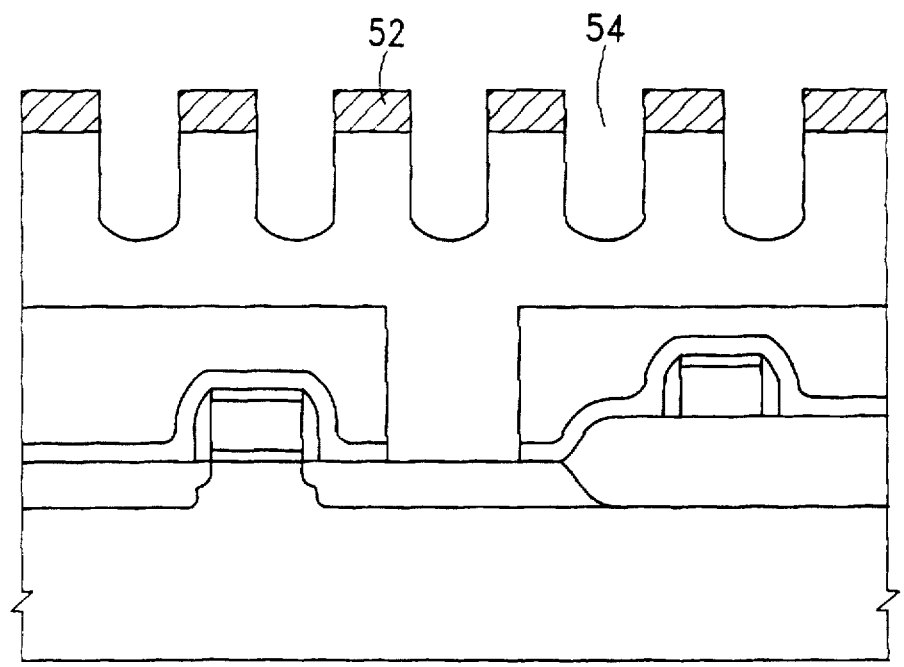

Using the polysilicon-oxide regions 52 as an etch mask, a single etching process is used to etch both the nitrogen regions 50 and the polysilicon layer 46. In this etching process, the nitrogen regions 50 are removed and the polysilicon layer 46 is etched to a depth of about 1000~4000 angstroms. As a result, a relatively large number of trenches 54 are formed in the polysilicon layer 46 as shown in FIG. 8. The nominal width of the trenches 54 is about the same as the nominal diameter of the HSG-Si grains and, thus, is significantly smaller than the minimum feature size of standard photolithography techniques. In this embodiment, a chemical dry etch (CDE) method is performed using fluorine etchant, forming the trenches 54 with slightly rounded bottom surfaces. Alternatively, other etching methods, such as reactive ion etching (RIE) can be used to form the trenches 54. For example, etchants such as $SF_6/O_2/Cl_2/HBr$ can be used in the RIE process to form the trenches 54. It is noted that squared trenches instead of rounded trenches will be formed if an RIE method is used. However, this small difference in shape on the bottom of the trench has minimum effect on the resultant memory capacitor.

Figure 9:
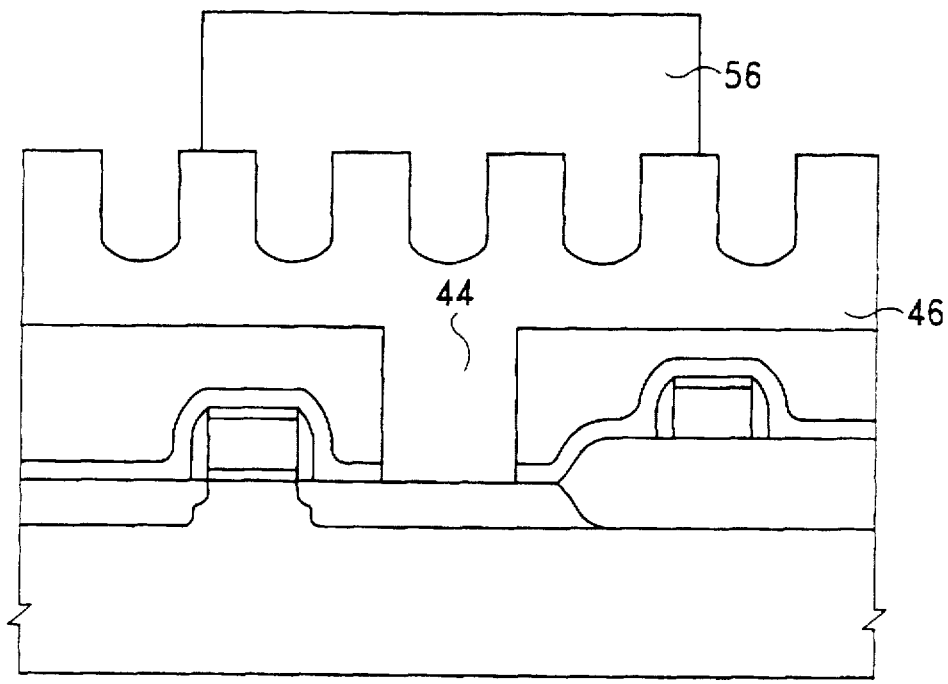

The polysilicon-oxide regions 52 are then removed. In this embodiment, a HF wet etching method is performed to etch the polysilicon-oxide regions 52 using the polysilicon layer 46 as an etch stop. Next, conventional photolithography techniques are used to form and pattern a photoresist layer 56 on the polysilicon layer 46. This photoresist layer 56 is patterned to form a storage node over the polysilicon layer. More specifically, the patterned photoresist layer 56 is aligned to cover the trench 44 and a portion of the polysilicon layer 46 surrounding the trench 44. The resulting structure in illustrated in FIG. 9.

Figure 10:
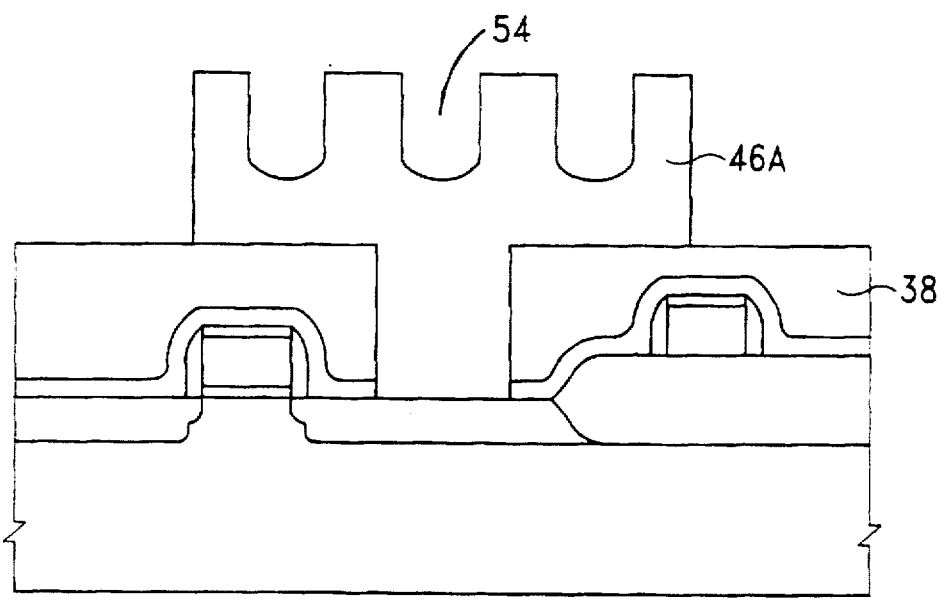

The polysilicon layer 46 is then etched using the photoresist layer 56 as a mask. In this embodiment, a MERIE plasma method is used to remove the exposed polysilicon, with the oxide layer 38 serving as an etch stop. The photoresist layer 56 is then removed using a conventional stripping process. FIG. 10 illustrates the resulting storage node 46A, which serves as a bottom electrode of the DRAM cell capacitor. The bottom electrode includes sub-minimum feature size trenches 54. The trenches 54 increase the surface area of the electrode, which increases the capacitance of the capacitor. The rest of the capacitor is formed in a conventional manner. For example, a capacitor dielectric layer can be formed on the storage node 46A using a conventional NO or ONO process. Then a doped polysilicon layer can be formed over the capacitor dielectric layer using a standard LPCVD process as used to form the polysilicon layer 46. This polysilicon layer can then be patterned and etched to form the top electrode of the DRAM storage cell capacitor.

Although several specific embodiments, including the preferred embodiment, have been illustrated and described, those skilled in the art will appreciate that, in light of the present disclosure, various modifications may be made to the described embodiments without departing from the spirit and scope of the present invention, which is intended to be limited solely by the appended claims.

What is claimed is:

1. A method for forming a capacitor of a dynamic random access memory cell, said method comprising:

forming a dielectric layer over a substrate;

forming and patterning a first photoresist layer on the dielectric layer, said first photoresist layer defining a contact area over a portion of the substrate surface;

removing a portion of the dielectric layer left uncovered by said first photoresist layer to form a first trench, thereby exposing said portion of the substrate surface;

forming a polysilicon layer over the dielectric layer, wherein said polysilicon layer fills in said first trench and covers at least a portion of the dielectric layer surrounding said first trench;

forming a hemispherical-grained silicon (HSG-Si) layer on the polysilicon layer, said HSG-Si layer comprising a plurality of silicon grains spaced apart, wherein portions of the polysilicon layer between said silicon grains remain uncovered by said HSG-Si layer;

implanting particles into the polysilicon layer using said plurality of silicon grains as a mask, thereby forming a plurality of particle regions in the polysilicon layer, wherein said particles cause said particle regions to have an increased resistance to oxidation;

removing said HSG-Si layer;

thermally oxidizing the polysilicon layer using said plurality of particle regions as an anti-oxidation mask, thereby forming a plurality of polysilicon-oxide regions in the polysilicon layer;

removing said plurality of particle regions and portions of the polysilicon layer left uncovered by said plurality of polysilicon-oxide regions, thereby forming a plurality of second trenches in the polysilicon layer;

removing said plurality of polysilicon-oxide regions;

forming and patterning a second photoresist layer on the polysilicon layer, wherein said second photoresist layer defines on said polysilicon layer a storage node aligned with the first trench; and removing portions of the polysilicon layer left uncovered by said second photoresist layer to form a storage node, said storage node serving as a bottom electrode of the capacitor of the dynamic random access memory.

2. The method according to claim 1, wherein said substrate includes a metal-oxide-semiconductor transistor formed in and on the substrate, said metal-oxide-semiconductor transistor being a part of the dynamic random access memory cell.

3. The method according to claim 1, wherein said dielectric layer comprises silicon oxide.

4. The method according to claim 1, wherein said plurality of silicon grains have a nominal diameter of about 50–500 angstroms, and wherein said plurality of silicon grains having a nominal spacing of about 100–1000 angstroms.

5. The method according to claim 1, wherein said HSG-Si layer is removed by a chemical-mechanical polish method.

6. The method according to claim 1, wherein said plurality of particle regions and portions of said polysilicon layer are removed using a chemical dry etch method.

7. The method according to claim 1, wherein said plurality of particle regions and portions of said polysilicon layer are removed using a reactive ion etch method.

8. The method according to claim 1, wherein said particles comprise nitrogen atoms.

9. The method according to claim 1, wherein said HSG-Si layer comprises initial phase HSG-Si.

10. A method for forming a capacitor of a dynamic random access memory cell, said method comprising:

forming a oxide layer over a substrate;

planarizing the oxide layer;

forming and patterning a first photoresist layer on the oxide layer, said first photoresist layer defining a contact area over a portion of the substrate surface;

removing a portion of the dielectric layer left uncovered by said first photoresist layer to form a first trench, thereby exposing said portion of the substrate surface;

forming a doped polysilicon layer over the oxide layer, wherein said first trench in the oxide layer is filled by the doped polysilicon layer;

forming a hemispherical-grained silicon (HSG-Si) layer on the doped polysilicon layer, said HSG-Si layer comprising a plurality of silicon grains spaced apart, wherein portions of the doped polysilicon layer between said silicon grains remain uncovered by said HSG-Si layer;

implanting nitrogen atoms in the doped polysilicon layer using said plurality of silicon grains as an implant mask, thereby forming a plurality of nitrogen regions in the doped polysilicon layer;

removing said HSG-Si layer;

thermally oxidizing the doped polysilicon layer using said plurality of nitrogen regions as an anti-oxidation mask, thereby forming a plurality of polysilicon-oxide regions in the doped polysilicon layer;

removing said plurality of nitrogen regions and portions of the doped polysilicon layer left uncovered by said plurality of polysilicon-oxide regions, thereby forming a plurality of second trenches in the doped polysilicon layer;

removing said plurality of polysilicon-oxide regions;

forming and patterning a second photoresist layer on the doped polysilicon layer, said second photoresist layer defining a storage node aligned with said first trench over a portion of said doped polysilicon layer; and removing portions of the doped polysilicon layer left uncovered by the second photoresist layer to form a storage node, said storage node serving as a bottom electrode of the capacitor of the dynamic random access memory.

11. The method according to claim 10, wherein said HSG-Si layer comprises initial phase HSG-Si.

12. The method according to claim 10, wherein said plurality of silicon grains have a nominal diameter of about 50-500 angstroms, and wherein said plurality of silicon grains having a nominal spacing of about 100-1000 angstroms.

13. The method according to claim 10, wherein forming said HSG-Si layer comprises:

depositing a HSG polysilicon layer over the doped polysyilicon layer; and etching back said HSG polysilicon layer, thereby forming said plurality of HSG silicon grains.

14. The method according to claim 10, wherein said plurality of nitrogen regions and portions of said doped polysilicon layer are removed using a chemical dry etch method.

15. The method according to claim 10, wherein said plurality of nitrogen regions and portions of said doped polysilicon layer are removed using a reactive ion etch method.

16. A method of forming an integrated circuit capacitor structure, the method comprising:

forming a polysilicon layer over a substrate;

forming a hemispherical-grained silicon (HSG-Si) layer on the polysilicon layer, said HSG-Si layer comprising a plurality of silicon grains spaced apart, wherein portions of the polysilicon layer between said silicon grains remain uncovered by said HSG-Si layer;

implanting nitrogen atoms in the polysilicon layer using said plurality of silicon grains as an implant mask, thereby forming a plurality of nitrogen regions in the polysilicon layer;

removing said HSG-Si layer;

thermally oxidizing the polysilicon layer using said plurality of nitrogen regions as an anti-oxidation mask, thereby forming a plurality of polysilicon-oxide regions in the polysilicon layer;

removing said plurality of nitrogen regions and portions of the polysilicon layer beneath said nitrogen regions, thereby forming a plurality of second trenches in the polysilicon layer between said plurality of polysilicon-oxide regions;

removing said plurality of polysilicon-oxide regions; and removing portions of the polysilicon layer, wherein a remaining portion of the polysilicon layer forms a bottom electrode of an integrated circuit capacitor.

17. The method according to claim 16, wherein said plurality of silicon grains have a nominal diameter of about 50-500 angstroms.

18. The method according to claim 17 wherein said plurality of silicon grains having a nominal spacing of about 100-1000 angstroms.

19. The method according to claim 18, wherein forming said HSG-Si layer comprises forming said HSG-Si layer using an initial phase HSG-Si process.

20. The method according to claim 16, wherein a single dry etching process is used to remove said nitrogen regions and portions of said polysyilicon layer beneath said nitrogen regions.

* * * * *